US012587152B2

(12) United States Patent
Scoles et al.

(10) Patent No.: US 12,587,152 B2
(45) Date of Patent: Mar. 24, 2026

(54) WIRELESS CIRCUITRY WITH MULTIPLE ENVELOPE TRACKING CIRCUITS

(71) Applicant: Apple Inc., Cupertino, CA (US)

(72) Inventors: Bradley D Scoles, Morgan Hill, CA (US); Qishan Yu, San Jose, CA (US); Christopher J Huber, North Reading, MA (US)

(73) Assignee: Apple, Inc., Cupertino, CA (US)

( * ) Notice: Subject to any disclaimer, the term of this patent is extended or adjusted under 35 U.S.C. 154(b) by 391 days.

(21) Appl. No.: 18/308,505

(22) Filed: Apr. 27, 2023

(65) Prior Publication Data

US 2024/0364282 A1 Oct. 31, 2024

(51) Int. Cl.
  *H03F 3/00* (2006.01)
  *H03F 3/24* (2006.01)

(52) U.S. Cl.
  CPC ....... *H03F 3/245* (2013.01); *H03F 2200/102* (2013.01); *H03F 2200/451* (2013.01)

(58) Field of Classification Search
  CPC .............. H03F 3/245; H03F 2200/102; H03F 2200/451; H03F 1/0227; H03F 3/19; H03F 3/195; H03F 3/72; H03F 3/68
  See application file for complete search history.

(56) References Cited

U.S. PATENT DOCUMENTS

| | | | |
|---|---|---|---|
| 9,461,590 B2 | 10/2016 | Langer | |
| 9,716,477 B2 | 7/2017 | Wagh et al. | |
| 9,973,147 B2 | 5/2018 | Khlat | |
| 10,630,375 B1 | 4/2020 | Khlat | |
| 11,256,642 B2 | 2/2022 | Ngo et al. | |
| 2019/0097671 A1 | 3/2019 | Dimpflmaier et al. | |
| 2020/0366248 A1* | 11/2020 | Ngo ..................... | H04L 67/1046 |
| 2024/0106467 A1* | 3/2024 | Keskin .................. | H03F 1/0288 |

FOREIGN PATENT DOCUMENTS

| | | |
|---|---|---|
| WO | 2020209421 A1 | 10/2020 |

* cited by examiner

*Primary Examiner* — Ping Y Hsieh

(74) *Attorney, Agent, or Firm* — Treyz Law Group; Jason Tsai

(57) ABSTRACT

An electronic device can include a first group of radio-frequency amplifiers coupled to one or more first antenna(s) disposed at a first end of the device, a second group of radio-frequency amplifiers coupled to one or more second antenna(s) disposed at a second opposing end of the device, a first envelope tracking integrated circuit (ETIC) coupled to the first group of radio-frequency amplifiers, and a second envelope tracking integrated circuit (ETIC) coupled to the second group of radio-frequency amplifiers. The first and second ETICs can be coupled together via a bidirectional input-output voltage path and a feedback voltage path. At least the first ETIC can include a first envelope tracking amplifier, a second envelope tracking amplifier, a voltage converter coupled to an output of the first envelope tracking amplifier, and a feedback controller coupled to an output of the second envelope tracking amplifier and configured to adjust the voltage converter.

20 Claims, 9 Drawing Sheets

WIRELESS CIRCUITRY WITH MULTIPLE ENVELOPE TRACKING CIRCUITS

FIELD

This disclosure relates generally to electronic devices and, more particularly, to electronic devices with wireless communications circuitry.

BACKGROUND

Electronic devices can be provided with wireless communications capabilities. An electronic device with wireless communications capabilities has wireless communications circuitry with one or more antennas. Wireless transceiver circuitry in the wireless communications circuitry uses the antennas to transmit and receive radio-frequency signals.

Radio-frequency signals transmitted by an antenna can be fed through one or more power amplifiers, which are configured to amplify low power analog signals to higher power signals more suitable for transmission through the air over long distances. It can be challenging to design power amplifiers disposed at different locations within an electronic device.

SUMMARY

An electronic device may include wireless communications circuitry. The wireless communications circuitry can include one or more processors or signal processing blocks for generating baseband signals, a transceiver for receiving the digital signals and for generating corresponding radio-frequency signals, and one or more radio-frequency amplifiers configured to amplify the radio-frequency signals for transmission by one or more antennas in the electronic device. The radio-frequency amplifiers can be provided with envelope tracking circuitry.

An aspect of the disclosure provides wireless circuitry that includes a first envelope tracking amplifier configured to output a first power supply voltage, a second envelope tracking amplifier configured to output a second power supply voltage, a voltage converter coupled to an output of the first envelope tracking amplifier, and a bidirectional input-output path selectively coupled to the voltage converter and selectively coupled to the second envelope tracking amplifier. The wireless circuitry can include a first radio-frequency amplifier having a power supply terminal configured to receive the first power supply voltage and a second radio-frequency amplifier having a power supply terminal configured to receive the second power supply voltage. The wireless circuitry can include a voltage switching circuit having a first port coupled to the first envelope tracking amplifier, a second port coupled to the second envelope tracking amplifier, a third port coupled to the first radio-frequency amplifier, a fourth port coupled to the second radio-frequency, and a fifth port coupled to the bidirectional input-output path. The wireless circuitry can include a plurality of digital-to-analog converter blocks, an input switching circuit coupled between the plurality of digital-to-analog converter blocks and the first and second envelope tracking amplifiers, a feedback controller coupled to an output of the second amplifier and configured to output a control signal to the voltage converter, and a bidirectional feedback path coupled to the feedback controller.

An aspect of the disclosure provides a method of operating wireless circuitry that includes using a first envelope tracking amplifier to output a first power supply voltage to a first radio-frequency amplifier, using a second envelope tracking amplifier to output a second power supply voltage to a second radio-frequency amplifier, using a voltage converter to assist the first envelope tracking amplifier with outputting the first power supply voltage, and using a bidirectional input-output path selectively coupled to the second envelope tracking amplifier to provide a direct current (DC) voltage to the second envelope tracking amplifier. The method can optionally further include selectively coupling the bidirectional input-output path to the first envelope tracking amplifier, using the bidirectional input-output path to convey a DC voltage output from the voltage converter, using an input switching circuit to couple a first digital-to-analog converter block to the first envelope tracking amplifier and to couple a second digital-to-analog converter block to the second envelope tracking amplifier, using a controller to sense the second power supply voltage output from the second envelope tracking amplifier and to output a control signal for adjusting the voltage converter, and/or using a bidirectional feedback path coupled to the controller to convey a feedback voltage output from the controller and to provide a feedback voltage as an input to the controller.

An aspect of the disclosure provides an electronic device that includes a first group of radio-frequency amplifiers, a second group of radio-frequency amplifiers, a first envelope tracking integrated circuit coupled to the first group of radio-frequency amplifiers, and a second envelope tracking integrated circuit coupled to the second group of radio-frequency amplifiers. The first and second envelope tracking integrated circuits can be operable in a first mode in which the first envelope tracking integrated circuit outputs a power supply voltage to a selected radio-frequency amplifier in the first group of radio-frequency amplifiers while the second envelope tracking integrated circuit outputs a power supply voltage to a selected radio-frequency amplifier in the second group of radio-frequency amplifiers, and can be operable in a second mode in which first envelope tracking integrated circuit outputs power supply voltages to the first group of radio-frequency amplifiers while the second group of radio-frequency amplifiers are idle. The first and second envelope tracking integrated circuits can be further operable in a third mode in which the second envelope tracking integrated circuit outputs power supply voltages to the second group of radio-frequency amplifiers while the first group of radio-frequency amplifiers are idle.

The first group of radio-frequency amplifiers can be coupled to one or more first antennas disposed at a first end of the electronic device, whereas the second group of radio-frequency amplifiers can be coupled to one or more second antennas disposed at a second end of the electronic device opposing the first end. The electronic device can further include a bidirectional input-output path configured to convey a direct current (DC) voltage between the first and second envelope tracking integrated circuits and can include a bidirectional feedback path configured to convey a feedback voltage between the first and second envelope tracking integrated circuits. Each of the first and second envelope tracking integrated circuits can include a first envelope tracking amplifier, a second envelope tracking amplifier, a voltage converter coupled to an output of the first envelope tracking amplifier, and a feedback controller coupled to an output of the second envelope tracking amplifier and configured to adjust the voltage converter.

DETAILED DESCRIPTION

Figure 1:
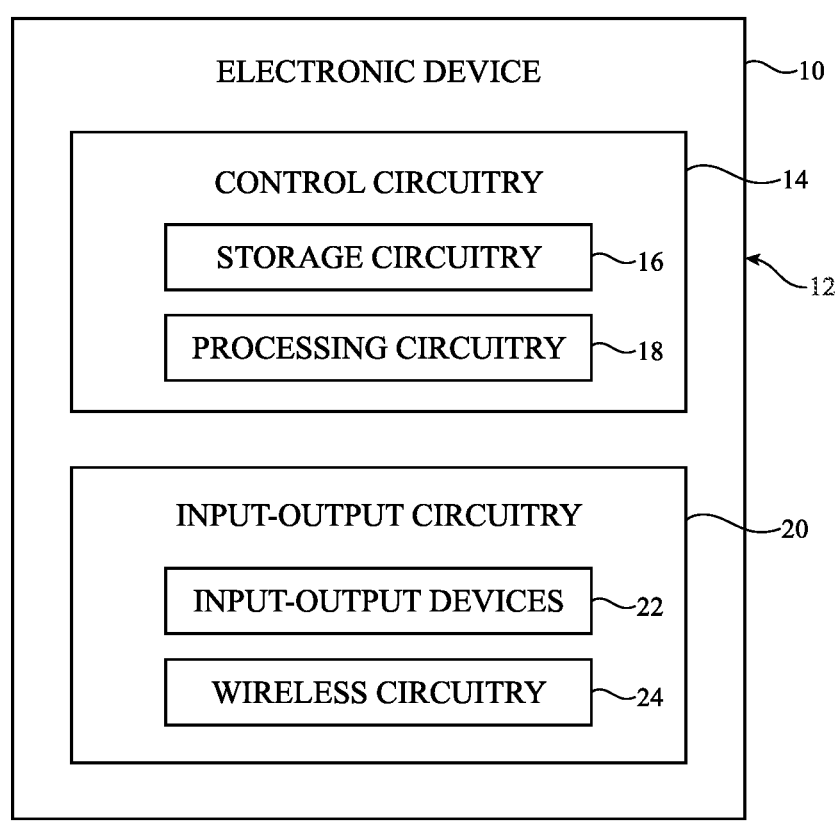
FIG. 1 is a diagram of an illustrative electronic device having wireless circuitry in accordance with some embodiments.

An electronic device such as device 10 of FIG. 1 may be provided with wireless circuitry. The wireless circuitry can include radio-frequency amplifiers such as radio-frequency power amplifiers. Power amplifiers are used to amplify radio-frequency signals in a transmit path. Envelope tracking techniques have been developed where the power supply voltage of a power amplifier is continuously adjusted so that the gain of the power amplifier remains constant over varying output power levels.

An electronic device may include at least first and second antennas disposed at opposing ends of the electronic device. The first antenna can be driven using a first group of one or more power amplifiers. The second antenna can be driven using a second group of one or more power amplifiers. The first group of power amplifiers can be controlled by first envelope tracking (ET) circuitry within a first integrated circuit (IC), whereas the second group of power amplifiers can be controlled by second ET circuitry within a second integrated circuit (IC). The first and second integrated circuits can each include a voltage converter and two separate envelope tracking amplifiers.

The wireless circuitry can be operable in at least three different modes. In a first mode, an ET amplifier in the first IC drives one of the first group of power amplifiers, whereas an ET amplifier in the second IC drives one of the second group of power amplifiers. In a second mode, the two ET amplifiers in the first IC are used simultaneously to drive two power amplifiers in the first group of power amplifiers. During the second mode, a feedback analog signal is routed from the first IC to the second IC via a first bidirectional path, whereas the voltage converter on the second IC outputs a DC voltage that is routed to the first IC via a second bidirectional path. In a third mode, the two ET amplifiers in the second IC are used simultaneously to drive two power amplifiers in the second group of power amplifiers. During the third mode, a feedback analog signal is routed from the second IC to the first IC via the first bidirectional path, whereas the voltage converter on the first IC outputs a DC voltage that is routed to the second IC via the second bidirectional path.

This type of power amplifier envelope tracking architecture can be technically advantageous and beneficial by providing improved battery life due to efficiency improvements, improved routing efficiency due to fewer routing connections, and improved output power efficiency by placing the power amplifiers closer to the transmitting antenna to help minimize insertion loss in the transmit path.

Electronic device 10 of FIG. 1 may be a computing device such as a laptop computer, a desktop computer, a computer monitor containing an embedded computer, a tablet computer, a cellular telephone, a media player, or other handheld or portable electronic device, a smaller device such as a wristwatch device, a pendant device, a headphone or earpiece device, a device embedded in eyeglasses or other equipment worn on a user's head, or other wearable or miniature device, a television, a computer display that does not contain an embedded computer, a gaming device, a navigation device, an embedded system such as a system in which electronic equipment with a display is mounted in a kiosk or automobile, a wireless internet-connected voice-controlled speaker, a home entertainment device, a remote control device, a gaming controller, a peripheral user input device, a wireless base station or access point, equipment that implements the functionality of two or more of these devices, or other electronic equipment.

As shown in the functional block diagram of FIG. 1, device 10 may include components located on or within an electronic device housing such as housing 12. Housing 12, which may sometimes be referred to as a case, may be formed from plastic, glass, ceramics, fiber composites, metal (e.g., stainless steel, aluminum, metal alloys, etc.), other suitable materials, or a combination of these materials. In some embodiments, parts or all of housing 12 may be formed from dielectric or other low-conductivity material (e.g., glass, ceramic, plastic, sapphire, etc.). In other embodiments, housing 12 or at least some of the structures that make up housing 12 may be formed from metal elements.

Device 10 may include control circuitry 14. Control circuitry 14 may include storage such as storage circuitry 16. Storage circuitry 16 may include hard disk drive storage, nonvolatile memory (e.g., flash memory or other electrically-programmable-read-only memory configured to form a solid-state drive), volatile memory (e.g., static or dynamic random-access-memory), etc. Storage circuitry 16 may include storage that is integrated within device 10 and/or removable storage media.

Control circuitry 14 may include processing circuitry such as processing circuitry 18. Processing circuitry 18 may be used to control the operation of device 10. Processing circuitry 18 may include on one or more microprocessors, microcontrollers, digital signal processors, host processors, baseband processor integrated circuits, application specific integrated circuits, central processing units (CPUs), etc. Control circuitry 14 may be configured to perform operations in device 10 using hardware (e.g., dedicated hardware or circuitry), firmware, and/or software. Software code for performing operations in device 10 may be stored on storage circuitry 16 (e.g., storage circuitry 16 may include non-transitory (tangible) computer readable storage media that stores the software code). The software code may sometimes be referred to as program instructions, software, data, instructions, or code. Software code stored on storage circuitry 16 may be executed by processing circuitry 18.

Control circuitry 14 may be used to run software on device 10 such as satellite navigation applications, internet browsing applications, voice-over-internet-protocol (VOIP) telephone call applications, email applications, media playback applications, operating system functions, etc. To support interactions with external equipment, control circuitry 14 may be used in implementing communications protocols. Communications protocols that may be implemented using control circuitry 14 include internet protocols, wireless local area network (WLAN) protocols (e.g., IEEE 802.11 protocols-sometimes referred to as Wi-Fi®), protocols for other short-range wireless communications links such as the Bluetooth® protocol or other wireless personal area network (WPAN) protocols, IEEE 802.11ad protocols (e.g., ultra-wideband protocols), cellular telephone protocols (e.g., 3G protocols, 4G (LTE) protocols, 5G protocols, etc.), antenna diversity protocols, satellite navigation system protocols (e.g., global positioning system (GPS) protocols, global navigation satellite system (GLONASS) protocols, etc.), antenna-based spatial ranging protocols (e.g., radio detection and ranging (RADAR) protocols or other desired range detection protocols for signals conveyed at millimeter and centimeter wave frequencies), or any other desired communications protocols. Each communications protocol may be associated with a corresponding radio access technology (RAT) that specifies the physical connection methodology used in implementing the protocol.

Device 10 may include input-output circuitry 20. Input-output circuitry 20 may include input-output devices 22. Input-output devices 22 may be used to allow data to be supplied to device 10 and to allow data to be provided from device 10 to external devices. Input-output devices 22 may include user interface devices, data port devices, and other input-output components. For example, input-output devices 22 may include touch sensors, displays (e.g., touch-sensitive and/or force-sensitive displays), light-emitting components such as displays without touch sensor capabilities, buttons (mechanical, capacitive, optical, etc.), scrolling wheels, touch pads, key pads, keyboards, microphones, cameras, buttons, speakers, status indicators, audio jacks and other audio port components, digital data port devices, motion sensors (accelerometers, gyroscopes, and/or compasses that detect motion), capacitance sensors, proximity sensors, magnetic sensors, force sensors (e.g., force sensors coupled to a display to detect pressure applied to the display), etc. In some configurations, keyboards, headphones, displays, pointing devices such as trackpads, mice, and joysticks, and other input-output devices may be coupled to device 10 using wired or wireless connections (e.g., some of input-output devices 22 may be peripherals that are coupled to a main processing unit or other portion of device 10 via a wired or wireless link).

Input-output circuitry 20 may include wireless circuitry 24 to support wireless communications. Wireless circuitry 24 (sometimes referred to herein as wireless communications circuitry 24) may include one or more antennas. Wireless circuitry 24 may also include baseband processor circuitry, transceiver circuitry, amplifier circuitry, filter circuitry, switching circuitry, radio-frequency transmission lines, and/or any other circuitry for transmitting and/or receiving radio-frequency signals using the antenna(s).

Wireless circuitry 24 may transmit and/or receive radio-frequency signals within a corresponding frequency band at radio frequencies (sometimes referred to herein as a communications band or simply as a "band"). The frequency bands handled by wireless circuitry 24 may include wireless local area network (WLAN) frequency bands (e.g., Wi-Fi® (IEEE 802.11) or other WLAN communications bands) such as a 2.4 GHz WLAN band (e.g., from 2400 to 2480 MHz), a 5 GHz WLAN band (e.g., from 5180 to 5825 MHz), a Wi-Fi® 6E band (e.g., from 5925-7125 MHZ), and/or other Wi-Fi® bands (e.g., from 1875-5160 MHz), wireless personal area network (WPAN) frequency bands such as the 2.4 GHZ Bluetooth® band or other WPAN communications bands, cellular telephone frequency bands (e.g., bands from about 600 MHz to about 5 GHZ, 3G bands, 4G LTE bands, 5G New Radio Frequency Range 1 (FR1) bands below 10 GHz, 5G New Radio Frequency Range 2 (FR2) bands between 20 and 60 GHz, etc.), other centimeter or millimeter wave frequency bands between 10-300 GHz, near-field communications frequency bands (e.g., at 13.56 MHZ), satellite navigation frequency bands (e.g., a GPS band from 1565 to 1610 MHz, a Global Navigation Satellite System (GLONASS) band, a BeiDou Navigation Satellite System (BDS) band, etc.), ultra-wideband (UWB) frequency bands that operate under the IEEE 802.15.4 protocol and/or other ultra-wideband communications protocols, communications bands under the family of 3GPP wireless communications standards, communications bands under the IEEE 802.XX family of standards, and/or any other desired frequency bands of interest.

Figure 2:
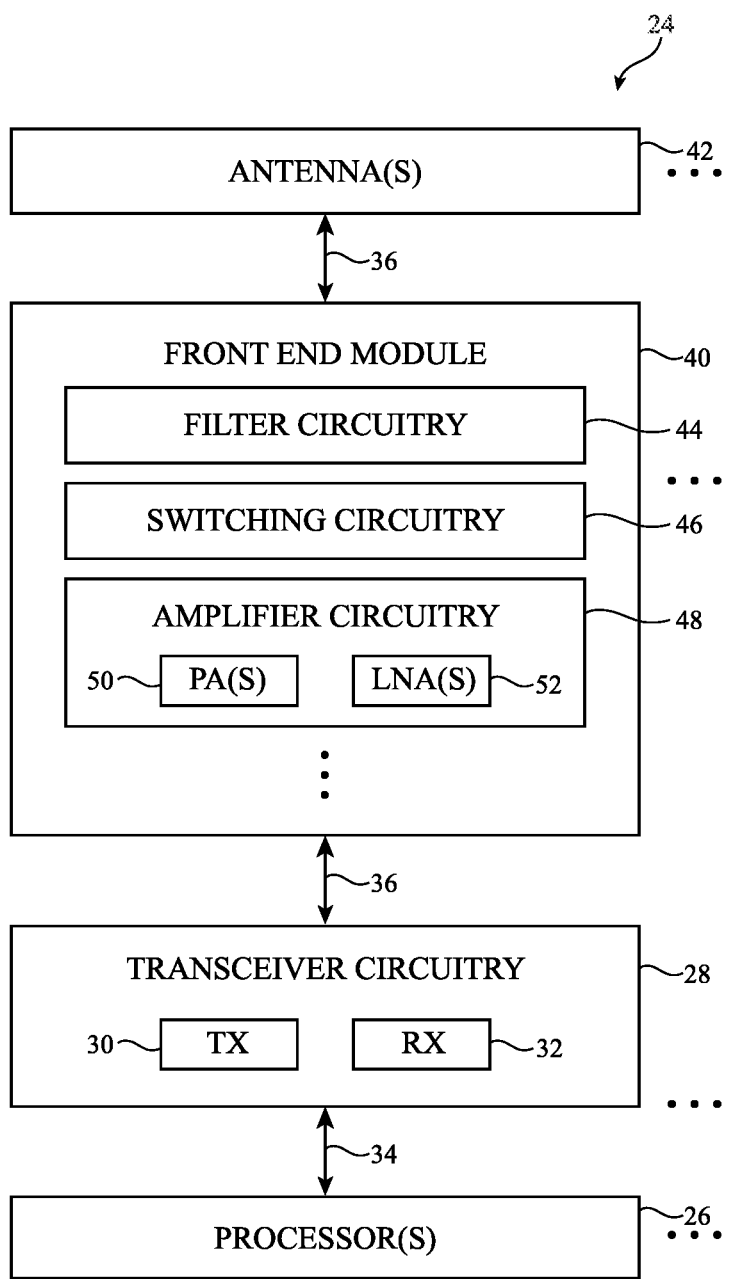
FIG. 2 is a diagram of illustrative wireless circuitry having radio-frequency amplifiers in accordance with some embodiments.

FIG. 2 is a diagram showing illustrative components within wireless circuitry 24. As shown in FIG. 2, wireless circuitry 24 may include a processor such as processor 26, radio-frequency (RF) transceiver circuitry such as radio-frequency transceiver 28, radio-frequency front end circuitry such as radio-frequency front end module (FEM) 40, and antenna(s) 42. Processor 26 may be a baseband processor, application processor, general purpose processor, microprocessor, microcontroller, digital signal processor, host processor, application specific signal processing hardware, or other type of processor. Processor 26 may be coupled to transceiver 28 over path 34. Transceiver 28 may be coupled to antenna 42 via radio-frequency transmission line path 36. Radio-frequency front end module 40 may be disposed on radio-frequency transmission line path 36 between transceiver 28 and antenna 42.

In the example of FIG. 2, wireless circuitry 24 is illustrated as including only a single processor 26, a single transceiver 28, a single front end module 40, and a single antenna 42 for the sake of clarity. In general, wireless circuitry 24 may include any desired number of processors 26, any desired number of transceivers 28, any desired number of front end modules 40, and any desired number of antennas 42. Each processor 26 may be coupled to one or more transceiver 28 over respective paths 34. Each transceiver 28 may include a transmitter circuit 30 configured to output uplink signals to antenna 42, may include a receiver circuit 32 configured to receive downlink signals from antenna 42, and may be coupled to one or more antennas 42 over respective radio-frequency transmission line paths 36. Each radio-frequency transmission line path 36 may have a respective front end module 40 disposed thereon. If desired, two or more front end modules 40 may be disposed on the same radio-frequency transmission line path 36. If desired, one or more of the radio-frequency transmission line paths 36 in wireless circuitry 24 may be implemented without any front end module disposed thereon.

Radio-frequency transmission line path 36 may be coupled to an antenna feed on antenna 42. The antenna feed may, for example, include a positive antenna feed terminal and a ground antenna feed terminal. Radio-frequency transmission line path 36 may have a positive transmission line signal path such that is coupled to the positive antenna feed terminal on antenna 42. Radio-frequency transmission line path 36 may have a ground transmission line signal path that is coupled to the ground antenna feed terminal on antenna 42. This example is illustrative and, in general, antennas 42 may be fed using any desired antenna feeding scheme. If desired, antenna 42 may have multiple antenna feeds that are coupled to one or more radio-frequency transmission line paths 36.

Radio-frequency transmission line path 36 may include transmission lines that are used to route radio-frequency antenna signals within device 10 (FIG. 1). Transmission lines in device 10 may include coaxial cables, microstrip transmission lines, stripline transmission lines, edge-coupled microstrip transmission lines, edge-coupled strip-line transmission lines, transmission lines formed from combinations of transmission lines of these types, etc. Transmission lines in device 10 such as transmission lines in radio-frequency transmission line path 36 may be integrated into rigid and/or flexible printed circuit boards.

In performing wireless transmission, processor 26 may provide transmit signals (e.g., digital or baseband signals) to transceiver 28 over path 34. Transceiver 28 may further include circuitry for converting the transmit (baseband) signals received from processor 26 into corresponding radio-frequency signals. For example, transceiver circuitry 28 may include mixer circuitry for up-converting (or modulating) the transmit (baseband) signals to radio frequencies prior to transmission over antenna 42. The example of FIG. 2 in which processor 26 communicates with transceiver 28 is illustrative. In general, transceiver 28 may communicate with a baseband processor, an application processor, general purpose processor, a microcontroller, a microprocessor, or one or more processors within circuitry 18. Transceiver circuitry 28 may also include digital-to-analog converter (DAC) and/or analog-to-digital converter (ADC) circuitry for converting signals between digital and analog domains. Transceiver 28 may use transmitter (TX) 30 to transmit the radio-frequency signals over antenna 42 via radio-frequency transmission line path 36 and front end module 40. Antenna 42 may transmit the radio-frequency signals to external wireless equipment by radiating the radio-frequency signals into free space.

Front end module (FEM) 40 may include radio-frequency front end circuitry that operates on the radio-frequency signals conveyed (transmitted and/or received) over radio-frequency transmission line path 36. FEM 40 may, for example, include front end module (FEM) components such as radio-frequency filter circuitry 44 (e.g., low pass filters, high pass filters, notch filters, band pass filters, multiplexing circuitry, duplexer circuitry, diplexer circuitry, triplexer circuitry, etc.), switching circuitry 46 (e.g., one or more radio-frequency switches), radio-frequency amplifier circuitry 48 (e.g., one or more power amplifier circuits 50 and/or one or more low-noise amplifier circuits 52), impedance matching circuitry (e.g., circuitry that helps to match the impedance of antenna 42 to the impedance of radio-frequency transmission line 36), antenna tuning circuitry (e.g., networks of capacitors, resistors, inductors, and/or switches that adjust the frequency response of antenna 42), radio-frequency coupler circuitry, charge pump circuitry, power management circuitry, digital control and interface circuitry, and/or any other circuitry that operates on the radio-frequency signals transmitted and/or received by antenna 42. Each of the front end module components may be mounted to a common (shared) substrate such as a rigid printed circuit board substrate or flexible printed circuit substrate. If desired, the various front end module components may also be integrated into a single integrated circuit chip. If desired, amplifier circuitry 48 and/or other components in front end 40 such as filter circuitry 44 may also be implemented as part of transceiver circuitry 28.

Filter circuitry 44, switching circuitry 46, amplifier circuitry 48, and other circuitry may be disposed along radio-frequency transmission line path 36, may be incorporated into FEM 40, and/or may be incorporated into antenna 42 (e.g., to support antenna tuning, to support operation in desired frequency bands, etc.). These components, sometimes referred to herein as antenna tuning components, may be adjusted (e.g., using control circuitry 14) to adjust the frequency response and wireless performance of antenna 42 over time.

Transceiver 28 may be separate from front end module 40. For example, transceiver 28 may be formed on another substrate such as the main logic board of device 10, a rigid printed circuit board, or flexible printed circuit that is not a part of front end module 40. While control circuitry 14 is shown separately from wireless circuitry 24 in the example of FIG. 1 for the sake of clarity, wireless circuitry 24 may include processing circuitry that forms a part of processing circuitry 18 and/or storage circuitry that forms a part of storage circuitry 16 of control circuitry 14 (e.g., portions of control circuitry 14 may be implemented on wireless circuitry 24). As an example, processor 26 and/or portions of transceiver 28 (e.g., a host processor on transceiver 28) may form a part of control circuitry 14. Control circuitry 14 (e.g., portions of control circuitry 14 formed on processor 26, portions of control circuitry 14 formed on transceiver 28, and/or portions of control circuitry 14 that are separate from wireless circuitry 24) may provide control signals (e.g., over one or more control paths in device 10) that control the operation of front end module 40.

Transceiver circuitry 28 may include wireless local area network transceiver circuitry that handles WLAN communications bands (e.g., Wi-Fi® (IEEE 802.11) or other WLAN communications bands) such as a 2.4 GHz WLAN band (e.g., from 2400 to 2480 MHZ), a 5 GHZ WLAN band (e.g., from 5180 to 5825 MHZ), a Wi-Fi® 6E band (e.g., from 5925-7125 MHZ), and/or other Wi-Fi® bands (e.g., from 1875-5160 MHZ), wireless personal area network transceiver circuitry that handles the 2.4 GHz Bluetooth® band or other WPAN communications bands, cellular telephone transceiver circuitry that handles cellular telephone bands (e.g., bands from about 600 MHz to about 5 GHZ, 3G bands, 4G LTE bands, 5G New Radio Frequency Range 1 (FR1) bands below 10 GHz, 5G New Radio Frequency Range 2 (FR2) bands between 20 and 60 GHz, etc.), near-field communications (NFC) transceiver circuitry that handles near-field communications bands (e.g., at 13.56 MHz), satellite navigation receiver circuitry that handles satellite navigation bands (e.g., a GPS band from 1565 to 1610 MHz, a Global Navigation Satellite System (GLO-NASS) band, a BeiDou Navigation Satellite System (BDS) band, etc.), ultra-wideband (UWB) transceiver circuitry that handles communications using the IEEE 802.15.4 protocol and/or other ultra-wideband communications protocols, and/or any other desired radio-frequency transceiver circuitry for covering any other desired communications bands of interest.

Wireless circuitry 24 may include one or more antennas such as antenna 42. Antenna 42 may be formed using any desired antenna structures. For example, antenna 42 may be an antenna with a resonating element that is formed from loop antenna structures, patch antenna structures, inverted-F antenna structures, slot antenna structures, planar inverted-F antenna structures, helical antenna structures, monopole antennas, dipoles, hybrids of these designs, etc. Two or more antennas 42 may be arranged into one or more phased antenna arrays (e.g., for conveying radio-frequency signals at millimeter wave frequencies). Parasitic elements may be included in antenna 42 to adjust antenna performance. Antenna 42 may be provided with a conductive cavity that backs the antenna resonating element of antenna 42 (e.g., antenna 42 may be a cavity-backed antenna such as a cavity-backed slot antenna).

As described above, front end module 40 may include one or more power amplifiers (PA) circuits 50 in the transmit (uplink) path. A power amplifier 50 (sometimes referred to as radio-frequency power amplifier, transmit amplifier, or amplifier) may be configured to amplify a radio-frequency signal without changing the signal shape, format, or modulation. Amplifier 50 may, for example, be used to provide 10 dB of gain, 20 dB of gain, 10-20 dB of gain, less than 20 dB of gain, more than 20 dB of gain, or other suitable amounts of gain.

It can be challenging to design a satisfactory radio-frequency power amplifier for an electronic device. In general, a radio-frequency amplifier is most efficient when it is operating in compression (i.e., when an increase in the input power results in a non-linear change in the output power of the amplifier, which typically occurs at the higher range of input power levels). Conventional radio-frequency power amplifiers that receive a fixed power supply voltage can become less efficient when the amplifier operates at lower input power levels.

In an effort to address this reduction in efficiency, an envelope tracking technique has been developed where the power supply voltage of the radio-frequency power amplifier is continuously adjusted such that the gain of the power amplifier remains constant over varying signal amplitudes (sometimes referred to as iso-gain operation). Other gain shaping strategies such as iso-compression operation, predefined gain-over-power characteristic, etc. are possible as well. As an example, an envelope tracking system can generate a variable power supply voltage using a static linear transformation of the absolute value of a baseband signal from which the radio-frequency signals are generated.

Figure 3:
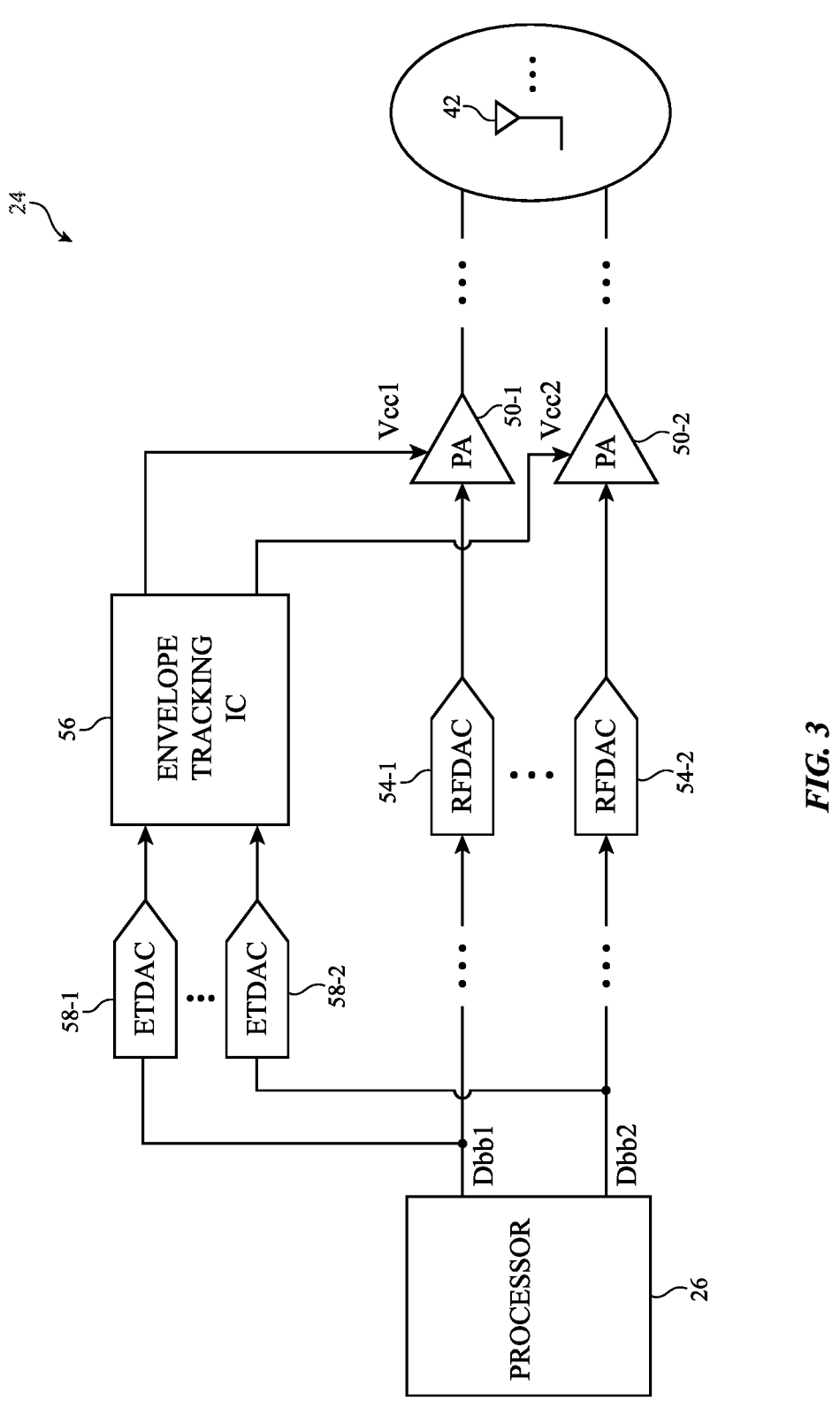
FIG. 3 is a diagram of illustrative wireless circuitry having an envelope tracking integrated circuit (ETIC) configured to control multiple radio-frequency amplifiers in accordance with some embodiments.

FIG. 3 is a diagram of illustrative wireless circuitry 24 having an envelope tracking integrated circuit (ETIC) configured to control multiple radio-frequency amplifiers in accordance with some embodiments. As shown in FIG. 3, wireless circuitry 24 may include processor 26, a first radio-frequency converter block such as radio-frequency converter block 54-1, a second radio-frequency converter block such as radio-frequency converter block 54-2, a first radio-frequency power amplifier such as radio-frequency amplifier 50-1, a second radio-frequency power amplifier such as radio-frequency amplifier 50-2, and one or more antenna(s) 42 configured to radiate radio-frequency signals output from amplifiers 50-1 and 50-2. Processor 26 may represent one or more processors such as a baseband processor, an application processor, a digital signal processor, a microcontroller, a microprocessor, a central processing unit (CPU), a programmable device, a combination of these circuits, and/or one or more processors within circuitry 18. Processor 26 may be configured to generate a first digital baseband signal Dbb1 and a second digital baseband signal Dbb2. Signals Dbb1 and Dbb2 are sometimes referred to as digital signals or transmit signals. As examples, the digital baseband signals generated by processor 26 may include in-phase (I) and quadrature-phase (Q) signals, radius and phase signals, a vector input, or other digitally coded signals.

Radio-frequency converter block 54-1 may be configured to convert digital baseband signals Dbb1 from the digital domain to the analog domain and to upconvert (modulate) the analog signals to radio frequencies. Radio-frequency converter block 54-2 may be configured to convert digital baseband signals Dbb2 from the digital domain to the analog domain and to upconvert (modulate) the analog signals to radio frequencies. The term "radio-frequency converter" may thus refer to or be defined herein as a circuit that can perform both signal domain conversion (e.g., digital to analog conversion) and frequency upconversion (e.g., from baseband frequencies to radio frequencies or intermediate frequencies). Baseband frequencies can range from a couple hundred Hz to a couple hundred MHz. The input of amplifier 50 configured to receive radio-frequency signals can be referred to or defined herein as a radio-frequency input (port). Radio frequencies can range from hundreds of MHz to tens of GHz.

RF converter blocks 54-1 and 54-2 may output corresponding radio-frequency signals to the radio-frequency inputs of amplifiers 50-1 and 50-2, respectively. Radio-frequency amplifier 50-1 may generate a corresponding amplified radio-frequency signal that can then be radiated by the one or more antenna(s) 42. Similarly, radio-frequency amplifier 50-2 may generate a corresponding amplified radio-frequency signal that can then be radiated by the one or more antenna(s) 42. In some embodiments, the amplified radio-frequency signals output from amplifiers 50-1 and 50-2 can be routed to a common (shared) antenna 42. In other embodiments, the amplified radio-frequency signal output from amplifiers 50-1 and 50-2 can be routed to separate antennas 42 to help minimize interference between the two transmit paths. The signal path associated with baseband signal Dbb1, RF converter block 54-1, and RF amplifier 50-1 is sometimes referred to herein as a first transmit path. The signal path associated with baseband signal Dbb2, RF converter block 54-2, and RF amplifier 50-2 is sometimes referred to herein as a second transmit path.

The example described above in which converter blocks 54-1 and 54-2 perform digital-to-analog conversion before conducting frequency upconversion in the analog domain is illustrative. In another embodiment, RF converter blocks 54-1 and 54-2 can perform frequency upconversion in the digital domain before conducting digital-to-analog conversion. In general, each RF converter block 54 (e.g., 54-1 and 54-2) may include a plurality of N individual digital-to-analog converters, each of which is sometimes referred to or defined herein as a radio-frequency DAC ("RFDAC") or RFDAC cell (e.g., each converter block 54 can include N separate radio-frequency DACs).

Wireless circuitry 24 may also include envelope tracking circuitry such as envelope tracking (ET) converter blocks 58-1 and 58-2 and an envelope tracking integrated circuit (ETIC) 56. Each ET converter block 58 (e.g., 58-1 and 58-2) may include a plurality of M individual digital-to-analog converters, each of which is sometimes referred to as an envelope tracking DAC ("ETDAC") or ETDAC cell (e.g., each converter block 58 can include M separate envelope tracking DACs). Envelope tracking converter block 58-1 can receive first digital baseband signal Dbb1 and output a corresponding first ET analog signal to ETIC 56, whereas envelope tracking converter block 58-2 can receive second digital baseband signal Dbb2 and output a corresponding second ET analog signal to ETIC 56. Envelope tracking IC 56 can be configured to continuously adjust the supply voltages of RF amplifiers 50-1 and 50-2 to ensure that amplifiers 50-1 and 50-2 are operating at peak efficiency.

As shown in FIG. 3, ETIC 56 (e.g., an integrated circuit die) may be configured to generate a first variable power supply voltage Vcc1 using a static linear transformation of the absolute value of baseband signal Dbb1, using a non-linearity estimator (e.g., an amplifier non-linearity estimator that models a non-linear behavior of amplifier 50-1), using an amplifier load response estimator (e.g., an amplifier load response estimator that implements a baseband model of a frequency-dependent response of a load at the output of amplifier 50-1), and/or using other circuitry that can dynamically tune the amplifier power supply voltage Vcc1. Similarly, ETIC 56 may be configured to generate a second variable power supply voltage Vcc2 using a static linear transformation of the absolute value of baseband signal Dbb2, using a non-linearity estimator (e.g., an amplifier non-linearity estimator that models a non-linear behavior of amplifier 50-2), using an amplifier load response estimator (e.g., an amplifier load response estimator that implements a baseband model of a frequency-dependent response of a load at the output of amplifier 50-2), and/or using other circuitry that can dynamically tune the amplifier power supply voltage Vcc2.

Power supply voltage Vcc1 can be fed to a power supply terminal of amplifier 50-1. The power supply terminal of amplifier 50-1 that receives Vcc1 from ETIC 56 can sometimes be referred to as a control input of amplifier 50-1. Similarly, power supply voltage Vcc2 can be fed to a power supply terminal of amplifier 50-2. The power supply terminal of amplifier 50-2 that receives Vcc2 from ETIC 56 can sometimes be referred to as a control input of amplifier 50-2. Tunable power supply voltages Vcc1 and Vcc2 can therefore sometimes be referred to and defined herein as control signals. Thus, ETIC 56 can sometimes be referred to generally as a control signal generator.

The example of FIG. 3 in which envelope tracking IC 56 is configured to adjust the supply of two radio-frequency amplifiers is illustrative. In general, envelope tracking IC 56 can be configured to the adjust the supply voltage of two or more amplifiers 50, three or more amplifiers 50, four or more amplifiers 50, five or more amplifiers 50, five to ten amplifiers 50, or more than ten amplifiers 50. The number of RFDAC blocks 54 can vary depending on the number of amplifiers 50. Similarly, the number of ETDAC blocks 58 can vary as a function of the number of amplifiers 50. In other words, the number of RFDAC blocks 54 and ETDAC blocks 58 can vary based on the number of transmit paths.

Figure 4:
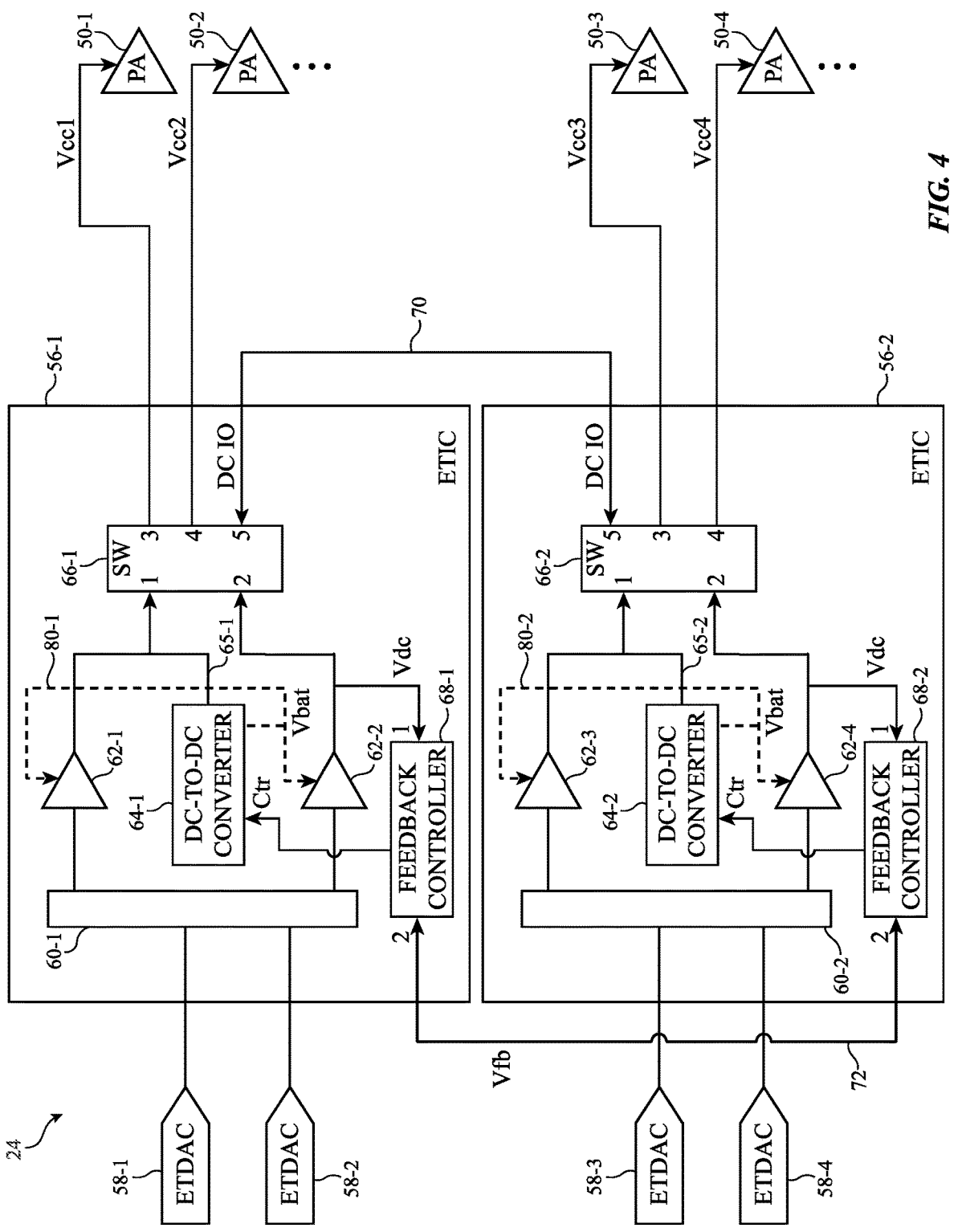
FIG. 4 is a diagram showing a first envelope tracking integrated circuit (ETIC) operable to control at least first and second radio-frequency amplifiers and a second envelope tracking integrated circuit (ETIC) operable to control at least third and fourth radio-frequency amplifiers in accordance with some embodiments.

The example of FIG. 3 in which wireless circuitry 24 includes at least one envelope tracking IC 56 is illustrative. FIG. 4 shows wireless circuitry 24 of an electronic device having multiple envelope tracking integrated circuit (ETIC) dies such as ETIC 56-1 and ETIC 56-2. As shown in FIG. 4, first ETIC 56-1 may have an input switching circuit such as input switching circuit 60-1, multiple envelope tracking amplifiers such as first ET amplifier 62-1 and second ET amplifier 62-2, a voltage converter such as voltage converter 64-1, a voltage switching circuit such as voltage switching circuit 66-1, and a feedback control circuit such as feedback controller 68-1. An envelope tracking amplifier can refer to or be defined herein an amplifier configured to output a varying power supply voltage for envelope tracking purposes (e.g., so that the gain of the corresponding RF amplifier remains constant over varying output power levels). Input switching circuit 60-1 may have a first input coupled to first ETDAC block 58-1, a second input coupled to second ETDAC block 58-2, a first output coupled to ET amplifier 62-1, and a second output coupled to ET amplifier 62-2. Input switching circuit 60-1 can be configured to connect ETDAC block 58-1 to a selected one of ET amplifiers 62-1 and 62-2 and can be configured to connect ETDAC block 58-2 to a selected one of ET amplifiers 62-1 and 62-2. Input switching circuit 60-1 operated in this way is sometimes referred to as an input multiplexer (mux) or an input crossbar switch.

First ET amplifier 62-1 has an input coupled to the first output of input switching circuit 60-1 and an output coupled to a first (1) port of voltage switching circuit 66-1. Second ET amplifier 62-2 has an input coupled to the second output of input switching circuit 60-1 and an output coupled to a second (2) port of voltage switching circuit 66-1. Voltage converter 64-1 may be a DC-to-DC (direct current to direct current) converter such as a buck-boost converter. This is exemplary. Voltage converter 64-1 can be a buck converter (e.g., a step-down voltage converter), a boost converter (e.g., a step-up voltage converter), a flyback converter (e.g., a transformer-based voltage converter), a low drop-output (LDO) converter, or other types of voltage converters. Voltage converter 64-1 can be configured to supply a bias voltage (e.g., an internal supply/battery voltage Vbat) to the power supply terminals of amplifiers 62-1 and 62-2 via dotted path 80-1 and can have an output coupled to the output of first ET amplifier 64-1 via path 65-1 (e.g., to help drive the output of amplifier 62-1).

Voltage switching circuit 66-1 may have a third (3) port that is coupled to a power supply terminal of radio-frequency (RF) amplifier 50-1, a fourth (4) port that is coupled to a power supply terminal of RF amplifier 50-2, and a fifth (5) port that is coupled to a bidirectional path 70. When the third port of circuit 66-1 is in use, an ET power supply voltage Vcc1 is provided to the power supply terminal of RF amplifier 50-1. When the fourth port of circuit 66-1 is in use, an ET power supply voltage Vcc2 is provided to the power supply terminal of RF amplifier 50-2. When the fifth port of circuit 66-1 is in use, a DC voltage output from voltage converter 64-1 can be provided onto path 70. Path 70 is therefore sometimes referred to and defined herein as a DC input-output (IO) connection.

Feedback controller 68-1 can have a first input configured to receive (sense) a DC voltage Vdc from the output of second ET amplifier 62-2, a second input configured to receive a feedback voltage Vfb from second ETIC 56-2 via a bidirectional feedback path 72, and an output on which a corresponding control signal Ctr is provided to voltage converter 64-1. Feedback controller 68-1 may compare the input voltages Vdc and Vfb to compute an error signal and to adjust control signal Ctr based on the computed error signal. In other words, feedback controller 68-1 may direct voltage converter 64-1 to increase its DC output voltage if voltage Vfb is too low or to decrease its DC output voltage if voltage Vfb is too high.

On the other hand, second ETIC 56-2 may have an input switching circuit such as input switching circuit 60-2, multiple envelope tracking amplifiers such as third ET amplifier 62-3 and fourth ET amplifier 62-4, a voltage converter such as voltage converter 64-2, a voltage switching circuit such as voltage switching circuit 66-2, and a feedback control circuit such as feedback controller 68-2. Input switching circuit 60-2 may have a first input coupled to third ETDAC block 58-3, a second input coupled to fourth ETDAC block 58-4, a first output coupled to ET amplifier 62-3, and a second output coupled to ET amplifier 62-4. Input switching circuit 60-2 can be configured to connect ETDAC block 58-3 to a selected one of ET amplifiers 62-3 and 62-4 and can be configured to connect ETDAC block 58-4 to a selected one of ET amplifiers 62-3 and 62-4. Input switching circuit 60-2 operated in this way is sometimes referred to as an input multiplexer or an input crossbar switch.

Third ET amplifier 62-3 has an input coupled to the first output of input switching circuit 60-2 and an output coupled to a first (1) port of voltage switching circuit 66-2. Fourth ET amplifier 62-4 has an input coupled to the second output of input switching circuit 60-2 and an output coupled to a second (2) port of voltage switching circuit 66-2. Voltage converter 64-2 may be a DC-to-DC converter such as a buck-boost converter. This is exemplary. Voltage converter 64-2 can be a buck converter (e.g., a step-down voltage converter), a boost converter (e.g., a step-up voltage converter), a flyback converter (e.g., a transformer-based voltage converter), a low drop-output (LDO) converter, or other types of voltage converters. Voltage converter 64-2 can be configured to supply a bias voltage (e.g., an internal supply/battery voltage Vbat) to the power supply terminals of amplifiers 62-3 and 62-4 via supply path 80-2 and can have an output coupled to the output of third ET amplifier 64-1 via path 65-2 (e.g., to help drive the output of amplifier 62-3).

Voltage switching circuit 66-2 may have a third (3) port that is coupled to a power supply terminal of radio-frequency (RF) amplifier 50-3, a fourth (4) port that is coupled to a power supply terminal of RF amplifier 50-4, and a fifth (5) port that is coupled to bidirectional DC voltage path 70. When the third port of circuit 66-2 is in use, an ET power supply voltage Vcc3 can be provided to the power supply terminal of RF amplifier 50-3. When the fourth port of circuit 66-2 is in use, an ET power supply voltage Vcc4 can be provided to the power supply terminal of RF amplifier 50-4. When the fifth port of circuit 66-2 is in use, a DC voltage output from voltage converter 64-2 can be provided onto path 70. Path 70 is therefore sometimes referred to and defined herein as a bidirectional DC input-output (IO) connection.

Feedback controller 68-2 can have a first input configured to receive (sense) a DC voltage Vdc from the output of fourth ET amplifier 62-4, a second input configured to receive a feedback voltage Vfb from the first ETIC 56-1 via bidirectional feedback path 72, and an output on which a corresponding control signal Ctr is provided to voltage converter 64-2. Feedback controller 68-2 may compare the input voltages Vdc and Vfb to compute an error signal and to adjust control signal Ctr based on the computed error signal. In other words, feedback controller 68-2 may direct voltage converter 64-2 to increase its DC output voltage if the received voltage Vfb is too low or to decrease its DC output voltage if voltage Vfb is too high.

The example of FIG. 4 in which each ETIC is configured to adjust the supply of two radio-frequency amplifiers is illustrative. In general, each envelope tracking IC (e.g., ETIC 56-1 and/or 56-2) can be configured to the adjust the supply voltage of two or more amplifiers 50, three or more amplifiers 50, four or more amplifiers 50, five or more amplifiers 50, five to ten amplifiers 50, or more than ten amplifiers 50. The number of ETDAC blocks 58 can vary as a function of the number of amplifiers 50.

Figure 5:
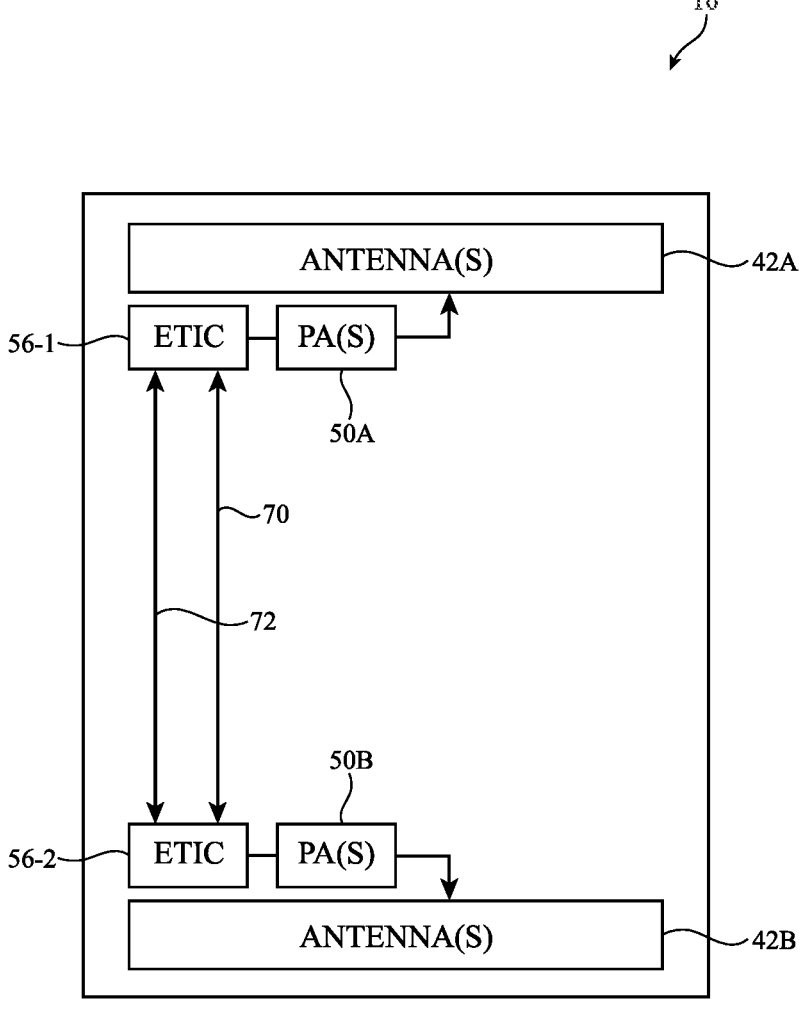
FIG. 5 is a diagram showing a top (plan) view of an illustrative electronic device having a first ETIC disposed near a first end of the electronic device and a second ETIC disposed near a second opposing end of the electronic device in accordance with some embodiments.

FIG. 5 is a diagram showing a top (plan) view of an illustrative electronic device 10 having a first ETIC 56-1 disposed near a first end of device 10 and a second ETIC 56-2 disposed near a second opposing end of device 10 in accordance with some embodiments. As shown in FIG. 5, one or more antenna(s) 42A can be disposed at the first (distal) end of device 10, whereas one or more antenna(s) 42B can be disposed at the second opposing end (distal) of device 10. Antenna(s) 42A is sometimes referred to as the upper antenna(s), whereas antenna(s) 42B is sometimes referred to as the lower antenna(s). The first ETIC 56-1 and the associated radio-frequency amplifiers 50A for driving the upper antenna(s) 42A can be disposed near the first end of device 10. The second ETIC 56-2 and the associated radio-frequency amplifiers 50B for driving the lower antenna(s) 42B can be disposed near the second end of device 10. First ETIC 56-1 and second ETIC 56-2 can be connected via at least two bidirectional paths 70 and 72. Bidirectional path 70 can be used to convey a DC voltage between the two ETICs, whereas bidirectional path 72 can be used to convey a feedback voltage between the two ETICs. The use of bidirectional connections 70 and 72 can reduce the number of inputs and outputs need, as well as reduce the number of PCB routes required.

Figure 6:
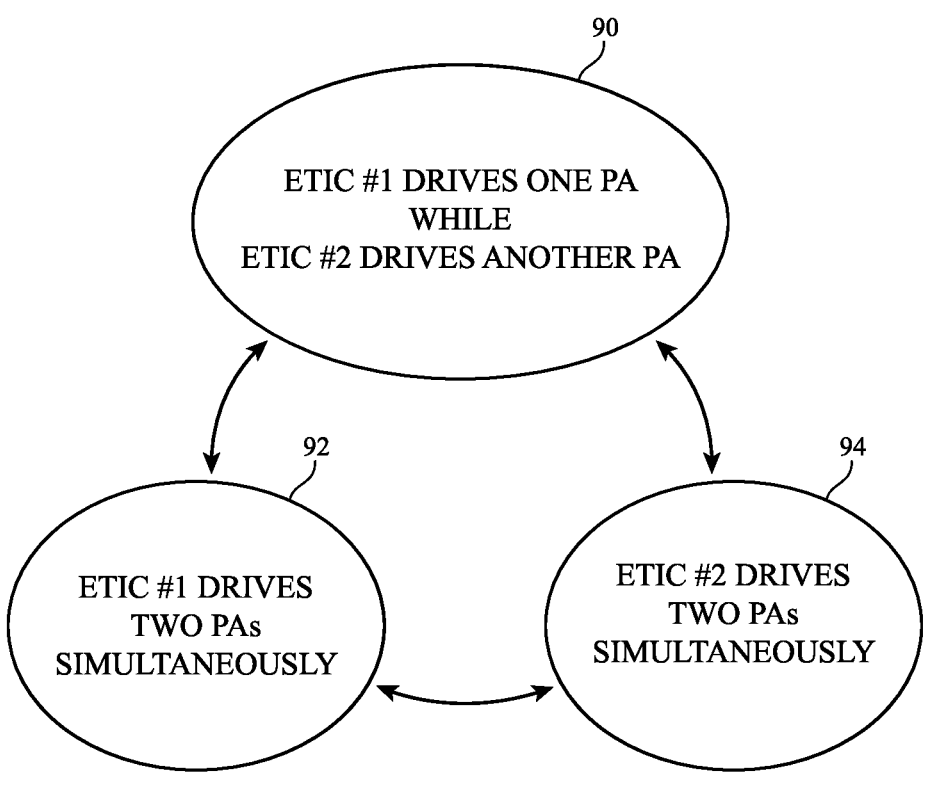
FIG. 6 is a state diagram illustrating different modes of operation for the wireless circuitry shown in FIG. 4 in accordance with some embodiments.

The ET amplifier driving an active power amplifier 50 should be physically close to that active power amplifier 50. By placing the ET amplifiers close to the RF amplifiers 50, insertion loss of the transmit path is minimized and can improve the output power efficiency. However, since a voltage converter (e.g., DC-to-DC converter 64) is only providing a DC voltage onto path 70, the voltage converter can be physically farther away from the ET amplifier being supplied. As a result, the ETIC architecture of the type described in connection with FIG. 3 is able to employ the two voltage converters 65-1 and 65-2 from separate ETICs located at opposing ends of device 10 to support various transmission modes as shown in FIG. 6. As shown in FIG. 6, the wireless circuitry is operable in at least a first mode 90, a second mode 92, and a third mode 94. In the first mode 90, the first ETIC 56-1 can drive one of the RF amplifiers 50A (e.g., amplifier 50-1 or 50-2) while the second ETIC 56-2 drives one of the RF amplifiers 50B (e.g., amplifier 50-3 or 50-4). In the second mode 92, the first ETIC 56-1 can drive multiple RF amplifiers 50A simultaneously (e.g., to drive both amplifiers 50-1 and 50-2 while amplifiers 50-3 and 50-4 are idle). In the third mode 94, the second ETIC 56-2 can drive multiple RF amplifiers 50B simultaneously (e.g., to drive both amplifiers 50-3 and 50-4 while amplifiers 50-1 and 50-2 are idle).

Figure 7:
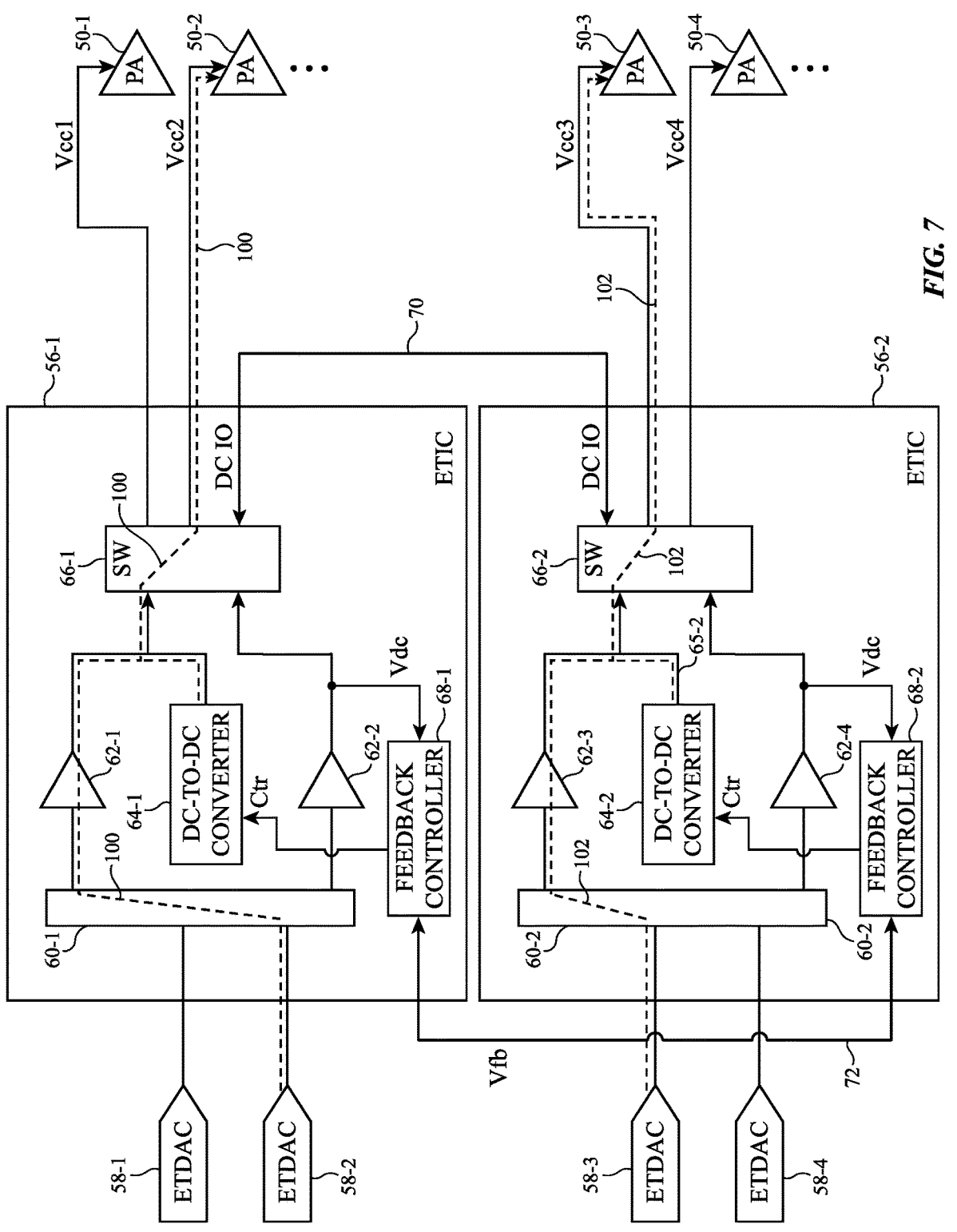
FIG. 7 is a diagram showing the wireless circuitry of FIG. 4 operating in a first mode in accordance with some embodiments.

FIG. 7 is a diagram showing the wireless circuitry of FIG. 4 operating in the first mode 90 in accordance with some embodiments. As shown in FIG. 7, input switching (mux) circuit 60-1 in ETIC 56-1 can be configured to connect ETDAC block 58-2 to ET amplifier 62-1 (see dotted path 100). Voltage converter 64-1 assists with the local ET amplifier 62-1 in driving power supply Vcc2 for the corresponding RF amplifier 50-2 via voltage switching circuit 66-1 (see signal path 100). Signal path 100 is exemplary. If desired, input switching circuit 60-1 can connect the first ETDAC block 58-1 to ET amplifier 62-1. If desired, voltage switching circuit 66-1 can alternatively connect ET amplifier 62-1 to RF amplifier 50-1.

Similarly for ETIC 56-2, input switching (mux) circuit 60-2 can be configured to connect ETDAC block 58-3 to ET amplifier 62-1 (see dotted path 102). Voltage converter 64-2 can assist with the local ET amplifier 62-3 in driving power supply Vcc3 for the corresponding RF amplifier 50-3 via voltage switching circuit 66-2 (see signal path 102). Signal path 102 is exemplary. If desired, input switching circuit 60-2 can alternatively connect the ETDAC block 58-4 to ET amplifier 62-3. If desired, voltage switching circuit 66-2 can alternatively connect ET amplifier 62-3 to RF amplifier 50-4. During first mode 90, the bidirectional paths 70 and 72 may be idle. The feedback controllers 68-1 and 68-2 can optionally be deactivated or placed in a default mode during mode 90.

Figure 8:
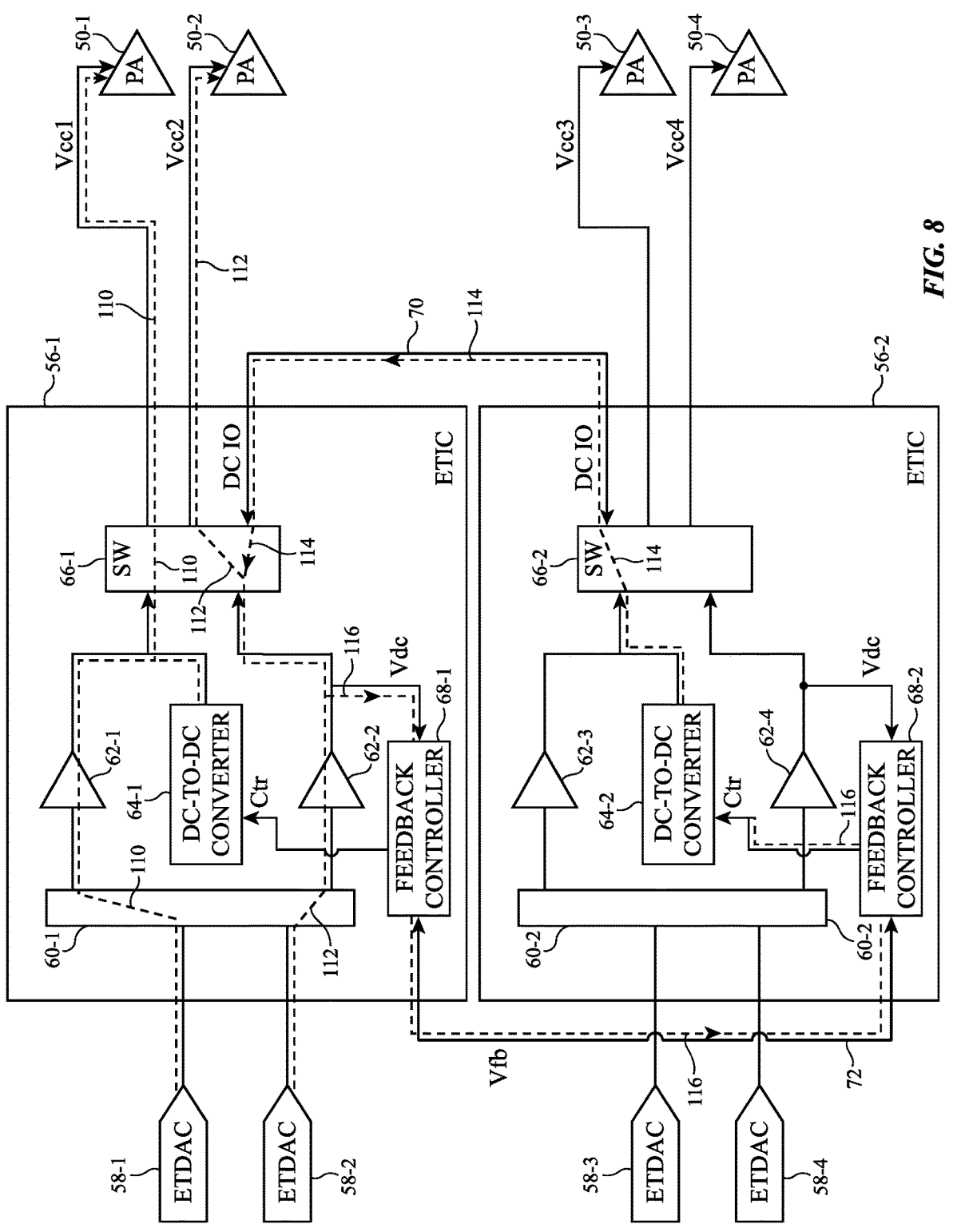
FIG. 8 is a diagram showing the wireless circuitry of FIG. 4 operating in a second mode in accordance with some embodiments.

FIG. 8 is a diagram showing the wireless circuitry of FIG. 4 operating in the second mode 92 in accordance with some embodiments. As shown in FIG. 8, input switching (mux) circuit 60-1 in ETIC 56-1 can be configured to connect ETDAC block 58-1 to ET amplifier 62-1 (see dotted path 110) and to connect ETDAC block 58-2 to ET amplifier 62-2 (see dotted path 112). DC-to-DC voltage converter 64-1 can assist with the local ET amplifier 62-1 in driving power supply Vcc1 for the corresponding RF amplifier 50-1 via voltage switching circuit 66-1 (see signal path 110). ET amplifier 62-2 can be used to drive power supply Vcc2 to corresponding RF amplifier 50-2 via voltage switching circuit 66-1 (see signal path 112).

To assist ET amplifier 62-2 with driving power supply Vcc2, DC-to-DC voltage converter 64-2 from the other ETIC 56-2 (e.g., the distant ETIC located at the other end of device 10 as shown in FIG. 5) can provide a DC voltage via bidirectional path 70 (see dotted signal path 114) and through voltage switching circuit 66-1. At the same time, feedback controller 68-1 can sense a DC voltage Vdc from the output of ET amplifier 62-2 and output a feedback voltage Vfb via bidirectional path 72 (see dotted signal path 116) to the feedback controller 68-2 in the remote ETIC 56-2. Feedback controller 68-2 can then output a corresponding control signal Ctr to adjust voltage converter 64-2 (see dotted control path 116) to complete the feedback control loop. Configured in this way, the DC-to-DC voltage converters 64-1 and 64-2 in the two physically separate ETICs can be used to drive the envelope tracking power supply voltages Vcc1 and Vcc2 for amplifying signals for the upper antenna(s) 42.

Figure 9:
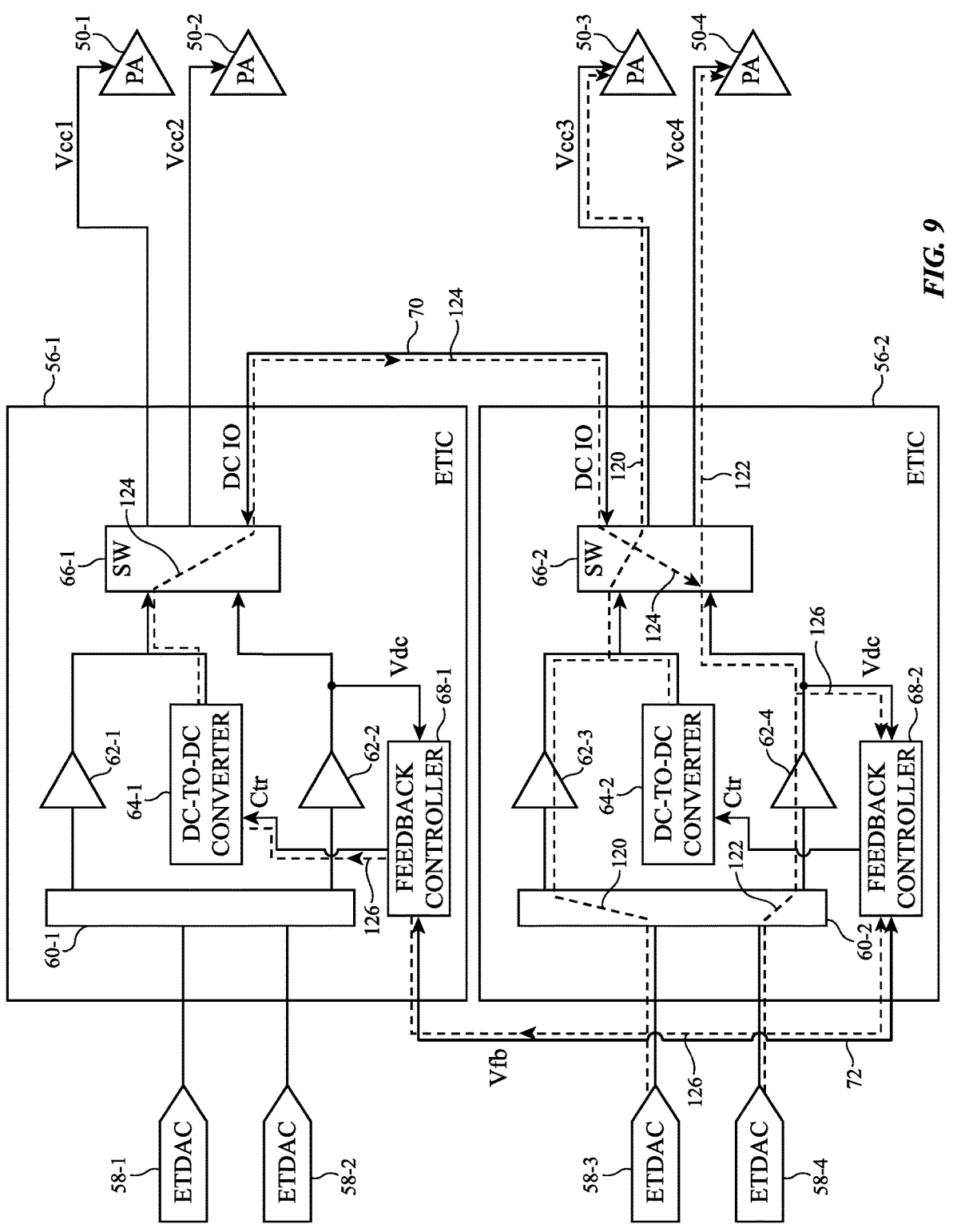
FIG. 9 is a diagram showing the wireless circuitry of FIG. 4 operating in a third mode in accordance with some embodiments.

FIG. 9 is a diagram showing the wireless circuitry of FIG. 4 operating in the third mode 94 in accordance with some embodiments. As shown in FIG. 9, input switching (mux) circuit 60-2 in ETIC 56-2 can be configured to connect ETDAC block 58-3 to ET amplifier 62-3 (see dotted path 120) and to connect ETDAC block 58-4 to ET amplifier 62-4 (see dotted path 122). DC-to-DC voltage converter 64-2 can assist with the local ET amplifier 62-3 in driving power supply Vcc3 for the corresponding RF amplifier 50-3 via voltage switching circuit 66-2 (see signal path 120). ET amplifier 62-4 can be used to drive power supply Vcc4 to corresponding RF amplifier 50-4 via voltage switching circuit 66-2 (see signal path 122).

To assist ET amplifier 62-4 with driving power supply Vcc4, DC-to-DC voltage converter 64-1 from the other ETIC 56-1 (e.g., the distant ETIC located at the other end of device 10 as shown in FIG. 5) can provide a DC voltage via bidirectional path 70 (see dotted signal path 124) and through voltage switching circuit 66-2. At the same time, feedback controller 68-2 can sense a DC voltage Vdc from the output of ET amplifier 62-4 and output a feedback voltage Vfb via bidirectional path 72 (see dotted signal path 126) to the feedback controller 68-1 in the remote ETIC 56-1. Feedback controller 68-1 can then output a corresponding control signal Ctr to adjust voltage converter 64-1 (see dotted control path 126) to complete the feedback control loop. Configured in this way, the DC-to-DC voltage converters 64-1 and 64-2 in the two physically separate ETICs can be used to drive the envelope tracking power supply voltages Vcc3 and Vcc4 for amplifying signals for the lower antenna(s) 42.

The methods and operations described above in connection with FIGS. 1-9 may be performed by the components of device 10 using software, firmware, and/or hardware (e.g., dedicated circuitry or hardware). Software code for performing these operations may be stored on non-transitory computer readable storage media (e.g., tangible computer readable storage media) stored on one or more of the components of device 10 (e.g., storage circuitry 16 and/or wireless communications circuitry 24 of FIG. 1). The software code may sometimes be referred to as software, data, instructions, program instructions, or code. The non-transitory computer readable storage media may include drives, non-volatile memory such as non-volatile random-access memory (NVRAM), removable flash drives or other removable media, other types of random-access memory, etc. Software stored on the non-transitory computer readable storage media may be executed by processing circuitry on one or more of the components of device 10 (e.g., processing circuitry in wireless circuitry 24, processing circuitry 18 of FIG. 1, etc.). The processing circuitry may include microprocessors, application processors, digital signal processors, central processing units (CPUs), application-specific integrated circuits with processing circuitry, or other processing circuitry.

The foregoing is exemplary and various modifications can be made to the described embodiments. The foregoing embodiments may be implemented individually or in any combination.

What is claimed is:

1. Wireless circuitry comprising:
   a first envelope tracking amplifier configured to produce, at a first amplifier output, a first power supply voltage;
   a second envelope tracking amplifier configured to produce, at a second amplifier output, a second power supply voltage;
   a voltage converter having an output coupled to the first amplifier output; and
   a bidirectional input-output path selectively coupled to the voltage converter and selectively coupled to the second envelope tracking amplifier.

2. The wireless circuitry of claim 1, further comprising:
   a first radio-frequency amplifier having a power supply terminal configured to receive the first power supply voltage; and
   a second radio-frequency amplifier having a power supply terminal configured to receive the second power supply voltage.

3. The wireless circuitry of claim 2, further comprising:
   a voltage switching circuit having a first port coupled to the first amplifier output, a second port coupled to the second amplifier output, a third port coupled to an input of the first radio-frequency amplifier, and a fourth port coupled to an input of the second radio-frequency amplifier.

4. The wireless circuitry of claim 3, wherein the voltage switching circuit further includes a fifth port coupled to the bidirectional input-output path.

5. The wireless circuitry of claim 1, further comprising:
   a plurality of digital-to-analog converter blocks; and
   an input switching circuit coupled between the plurality of digital- to-analog converter blocks and the first and second envelope tracking amplifiers.

6. The wireless circuitry of claim 1, further comprising:
   a feedback controller coupled to an output of the second envelope tracking amplifier and configured to output a control signal to the voltage converter.

7. The wireless circuitry of claim 6, further comprising:
   a bidirectional feedback path coupled to the feedback controller.

8. The wireless circuitry of claim 1, wherein the voltage converter comprises a DC-to-DC converter.

9. A method of operating wireless circuitry comprising:

with a first envelope tracking amplifier, outputting a first power supply voltage to a first radio-frequency amplifier;

with a second envelope tracking amplifier, outputting a second power supply voltage to a second radio-frequency amplifier;

with a voltage converter, assisting the first envelope tracking amplifier with outputting the first power supply voltage; and with a bidirectional input-output path selectively coupled to the second envelope tracking amplifier, providing a direct current (DC) voltage to the second envelope tracking amplifier.

10. The method of claim 9, further comprising:

selectively coupling the bidirectional input-output path to the first envelope tracking amplifier.

11. The method of claim 9, further comprising:

with the bidirectional input-output path, conveying a DC voltage output from the voltage converter.

12. The method of claim 9, further comprising:

with an input switching circuit, coupling a first digital-to-analog converter block to the first envelope tracking amplifier; and with the input switching circuit, coupling a second digital-to- analog converter block to the second envelope tracking amplifier.

13. The method of claim 9, further comprising:

with a controller, sensing the second power supply voltage output from the second envelope tracking amplifier and outputting a control signal for adjusting the voltage converter.

14. The method of claim 13, further comprising:

with a bidirectional feedback path coupled to the controller, conveying a feedback voltage output from the controller.

15. The method of claim 13, further comprising:

with a bidirectional feedback path, providing a feedback voltage as an input to the controller.

16. An electronic device comprising:

a first group of radio-frequency amplifiers;

a second group of radio-frequency amplifiers;

a first envelope tracking integrated circuit coupled to the first group of radio-frequency amplifiers; and a second envelope tracking integrated circuit coupled to the second group of radio-frequency amplifiers, wherein the first and second envelope tracking integrated circuits are operable in a first mode in which the first envelope tracking integrated circuit outputs a power supply voltage to a selected radio-frequency amplifier in the first group of radio-frequency amplifiers while the second envelope tracking integrated circuit outputs a power supply voltage to a selected radio-frequency amplifier in the second group of radio-frequency amplifiers, and a second mode in which first envelope tracking integrated circuit outputs power supply voltages to the first group of radio-frequency amplifiers while the second group of radio-frequency amplifiers are idle.

17. The electronic device of claim 16, wherein the first and second envelope tracking integrated circuits are further operable in a third mode in which the second envelope tracking integrated circuit outputs power supply voltages to the second group of radio-frequency amplifiers while the first group of radio-frequency amplifiers are idle.

18. The electronic device of claim 16, further comprising:

one or more first antennas coupled to the first group of radio-frequency amplifiers and disposed at a first end of the electronic device; and one or more second antennas coupled to the second group of radio-frequency amplifiers and disposed at a second end of the electronic device, different than the first end.

19. The electronic device of claim 16, further comprising:

a bidirectional input-output path configured to convey a direct current (DC) voltage between the first and second envelope tracking integrated circuits; and a bidirectional feedback path configured to convey a feedback voltage between the first and second envelope tracking integrated circuits.

20. The electronic device of claim 16, wherein at least the first envelope tracking integrated circuit comprises:

a first envelope tracking amplifier;

a second envelope tracking amplifier;

a voltage converter coupled to an output of the first envelope tracking amplifier; and a feedback controller coupled to an output of the second envelope tracking amplifier and configured to adjust the voltage converter.

* * * * *